(12) United States Patent
Hayashi et al.

(10) Patent No.: US 8,322,596 B2
(45) Date of Patent: Dec. 4, 2012

(54) WIRING SUBSTRATE MANUFACTURING METHOD

(75) Inventors: Takahiro Hayashi, Komaki (JP); Satoru Watanabe, Minokamo (JP); Hajime Saiki, Konan (JP); Koji Sakuma, Komaki (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 13/217,002

(22) Filed: Aug. 24, 2011

(65) Prior Publication Data
US 2012/0048914 A1 Mar. 1, 2012

(30) Foreign Application Priority Data
Aug. 25, 2010 (JP) .................... 2010-188464

(51) Int. Cl.
*B23K 31/02* (2006.01)
*H01L 21/28* (2006.01)

(52) U.S. Cl. .................... 228/246; 228/180.22; 228/254; 438/613

(58) Field of Classification Search .................... None
See application file for complete search history.

(56) References Cited

U.S. PATENT DOCUMENTS

| | | | |
|---|---|---|---|
| 6,998,336 B1 | 2/2006 | Iba et al. | |
| 7,845,847 B2 * | 12/2010 | Yakymyshyn et al. | 374/119 |
| 8,070,048 B2 * | 12/2011 | Oh et al. | 228/180.22 |
| 2003/0030149 A1 * | 2/2003 | Miura et al. | 257/772 |
| 2005/0224560 A1 * | 10/2005 | Takesue | 228/180.22 |
| 2009/0130838 A1 * | 5/2009 | Sakaguchi et al. | 438/613 |
| 2011/0193203 A1 * | 8/2011 | Goto et al. | 257/659 |

FOREIGN PATENT DOCUMENTS
JP 2006-173143 A 6/2006

OTHER PUBLICATIONS
Hayashi et al., copending U.S. Appl. No. 13/215,661, filed Aug. 23, 2011.

\* cited by examiner

*Primary Examiner* — Kiley Stoner
(74) *Attorney, Agent, or Firm* — Stites & Harbison PLLC; Jeffrey A. Haeberlin; Nicolo Davidson

(57) ABSTRACT

A wiring substrate manufacturing method includes: preparing a wiring substrate including a core layer having a principal surface, a resin insulating layer and a conductor layer alternately laminated to form at least one laminated layer on the one principal surface of the core layer, a solder resist layer including opening portions and formed on an outermost surface of the at least one laminated layer such that respective portions of an outermost conductor layer are exposed from the opening portions; forming a Sn-containing underlying layer on the respective portions of the outermost conductor layer by a plating process; and fusing the Sn-containing underlying layer to the respective portions of the outermost conductor layer by a heating process, then mounting solder balls directly on respective portions of the Sn-containing underlying layer, and then connecting the solder balls to the respective portions of the Sn-containing underlying layers.

4 Claims, 8 Drawing Sheets

WIRING SUBSTRATE MANUFACTURING METHOD

CROSS-REFERENCE TO RELATED APPLICATIONS

The present application claims priority from Japanese Patent Application No. 2010-188464, which was filed on Aug. 25, 2010, the disclosure of which is herein incorporated by reference in its entirety.

BACKGROUND OF THE INVENTION

1. Technical Field

The present invention relates to a wiring substrate manufacturing method.

2. Description of Related Art

In recent years, manufacturers have eagerly produced a semiconductor package utilizing a wiring substrate (also referred to herein as a "wiring substrate assembly"), in which a conductor layer and a resin insulating layer are laminated alternately in at least one layer (i.e., a laminated layer combining the alternately laminated conductor layer and resin insulating layer) respectively on at least one principal surface of a core layer, and then a solder resist layer is formed on the outermost surface thereof, i.e., a so-called resin-made wiring substrate. Then, a semiconductor device is mounted thereon.

The semiconductor device is connected electrically to the wiring substrate via respective solder bumps that are formed on pads in a semiconductor device mounting portion on a principal surface of the wiring substrate. In contrast, external terminals connected electrically to a base substrate or inserted in sockets and connected electrically thereto are formed on a back surface side of the wiring substrate. Here, according to a package mode of the external terminals, the wiring substrates are classified into a ball grid array (BGA), a pin grid array (PGA), etc.

A wiring substrate of the PGA type can be obtained by inserting pins into respective opening portions that are formed in a solder resist layer of the wiring substrate assembly, and then electrically connecting the pins to an outermost conductor layer exposed from the opening portions respectively.

A wiring substrate of the BGA type can be obtained by applying a fluxing process to portions of the outermost conductor layer exposed from opening portions formed in the solder resist layer of the wiring substrate assembly, if necessary, to remove the oxide film, then mounting solder balls on the respective exposed portions of the conductor layer, and then applying a reflow soldering process to the solder balls.

However, in the case of the wiring substrate of the BGA type, when the solder balls are formed directly on the portions of the conductor layer, adhesion of the solder balls to the portions of the conductor layer cannot be improved by the reflow soldering process, and thus the solder balls get out of (i.e., are dislodged from) their original mounting positions. For example, in some cases the electrical and mechanical connection between the wiring substrate and the base substrate cannot be sufficiently maintained.

In order to deal with such problem, a method has been proposed in which the fluxing process is applied to the portions of the conductor layer exposed from opening portions formed in the solder resist layer on the wiring substrate assembly, if necessary, then a predetermined solder paste is printed on the portions of the conductor layer. Then, respective portions of an underlying layer located under the solder balls are formed by reflowing the solder paste. Then, the solder balls are mounted on the respective portions of the underlying layer, and then the solder balls are connected to them by applying the reflow soldering process (see: JP-A-2006-173143 Official Gazette). In this case, the solder balls are connected to the respective portions of the conductor layer via the portions of the underlying layer, and therefore adhesion of the solder balls to the portions of the conductor layer can be improved rather than the case where the solder balls are connected directly to the portions of the conductor layer mutually.

However, the solder paste is formed like a hemispherical shape by the reflow soldering process. Therefore, a contact area between the underlying layer formed of such solder paste and the solder ball mounted thereon is decreased, and adhesion between them cannot be sufficiently maintained or improved. As a result, like the above, in some cases, the solder balls get out of (i.e., are dislodged from) their original mounting positions, and thus the electrical and mechanical connection between the wiring substrate and the base substrate cannot be sufficiently maintained.

A degree at which the solder ball is exposed from the opening portion is increased as a depth of the opening portion is decreased and/or a thickness of the underlying layer, particularly a thickness in the center portion, is increased. Thus, a shearing force that acts to the solder ball in the lateral direction is increased. Therefore, there is such a tendency that, as a depth of the opening portion is decreased and/or a thickness of the underlying layer is increased, the above phenomenon becomes more conspicuous.

In this case, when the underlying layer formed of a hemispherical solder paste is pressed by a predetermined planarizing machine, such underlying layer can be made flat to some extent, nevertheless the complicated and extra process, i.e., the use of the planarizing machine, is needed. Thus, there is such a problem that the total processes of the manufacturing method become complicated. Even when the underlying layer is made flat, a thickness of the entire underlying layer is increased, particularly, when a depth of the opening portion is small, adhesion between the solder ball and the underlying layer is not enough, and thus the solder balls get out of (i.e., are dislodged from) their original mounting positions. As a result, the problem such that the electrical and mechanical connection between the wiring substrate and the base substrate cannot be sufficiently maintained and cannot be sufficiently improved.

BRIEF SUMMARY OF THE INVENTION

It is an object of the present invention to provide a new wiring substrate manufacturing method capable of improving adhesion between a conductor layer and solder balls in a so-called wiring substrate of BGA type, in which a conductor layer and a resin insulating layer are laminated alternately in at least one layer (i.e., a laminated layer combining the alternately laminated conductor layer and resin insulating layer) respectively on at least one principal surface of a core layer, and then a solder resist layer is formed on an outermost surface thereof.

In order to attain the above object, the present invention is concerned with a wiring substrate manufacturing method, which includes:

preparing a wiring substrate including a core layer having a principal surface, a resin insulating layer and a conductor layer alternately laminated to form at least one laminated layer on the principal surface of the core layer, a solder resist layer including opening portions and formed on an outermost surface of the at least one laminated layer such that respective portions of an outermost conductor layer are exposed from the opening portions;

forming a Sn-containing underlying layer on the respective portions of the outermost conductor layer by a plating process; and fusing the Sn-containing underlying layer by a heating process, then mounting solder balls directly on respective portions of the fused Sn-containing underlying layer, and then connecting the solder balls to the respective portions of the Sn-containing underlying layer.

According to the present invention, not the conventional solder paste but the Sn-containing underlying layer is formed by the plating on the conductor layer exposed from the openings formed in the solder resist layer, concretely the portions of the conductor layer exposed from the opening portions in the wiring substrate, in which the conductor layer and the resin insulating layer are laminated alternately in at least one layer respectively on at least one principal surface of the core layer, and then the solder resist layer is formed on the outermost surfaces. Therefore, a shape of the underlying layer is flat, and the underlying layer contains Sn as a main component of the solder. Accordingly, when such underlying layer is fused by the heating and then the solder balls are mounted thereon, the solder balls can be connected firmly to the underlying layer.

Further, a thickness of the underlying layer can be adjusted to a desired level by controlling the forming condition such as a forming time, etc. applied to the underlying layer. Accordingly, even when a depth of the opening portion formed in the solder resist layer is set small in such a situation that a thickness of the underlying layer is maintained to enhance the adhesion to the solder ball, a thickness of the underlying layer can be kept sufficiently small, and thus an extent to which the solder ball is exposed from the opening portion can be made sufficiently small. Therefore, a shearing force acting to the solder ball in the lateral direction can be further decreased.

As a result, the solder balls never get out of the original mounting positions, and the electrical and mechanical connection between the wiring substrate and the base substrate can be held in the good condition.

In an example of the present invention, it is preferable that a thickness of the solder resist layer corresponding to a depth of the opening portion (i.e., the depth to reach the outermost conductor layer) should be set to 10 μm to 40 μm. In this case, the advantages of the present invention, i.e., the displacement of the solder balls from the original mounting position can be prevented and also the electrical and mechanical connection between the wiring substrate and the base substrate can be held in the good condition, can be achieved more effectively.

In an example of the present invention, it is preferable that a thickness of the Sn-containing underlying layer should be set within a range of 1 μm to 5 μm. In this case, even when a depth of the opening portion is set to 10 μm to 40 μm, as described above, in such a situation that adhesion to the solder ball is held sufficiently highly, a degree at which the solder ball is exposed from the opening portion can be sufficiently decreased, and a shearing force acting to the solder ball in the lateral direction can be reduced. Accordingly, the advantage of the present invention such that the displacement of the solder balls from the original mounting position can be prevented and that the electrical and mechanical connection between the wiring substrate and the base substrate can be held in the good condition can be achieved more effectively.

Further, in an example of the present invention, it is preferable that the underlying layer contains Ag in an amount of (i.e., by) 0.1 mass % to 1 mass %. For example, when the underlying layer is formed of Sn only, in some cases a whisker occurs from the underlying layer on a time-dependent basis, and this whisker comes into contact with the base substrate, or the like and exerts a bad influence upon the electrical contact with the wiring substrate. In this case, when the underlying layer contains a minute amount of Ag as described above, occurrence of the above-mentioned whisker can be suppressed. Accordingly, the above-mentioned bad electrical influence can be suppressed.

As explained above, according to the present invention, the new wiring substrate manufacturing method capable of improving the adhesion between the conductor layer and the solder ball, in the so-called wiring substrate of the BGA type in which the conductor layer and the resin insulating layer are stacked in at least one laminated layer respectively on at least one principal surface of the core layer, and the solder resist layer is formed on the outermost surface.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Exemplary Wiring Substrate

An embodiment of the present invention will be explained with reference to the drawings hereinafter.

First, a configuration of an exemplary wiring substrate that is to be manufactured by the method of the present invention will be explained hereunder. Here, the wiring substrate shown hereunder is given only by way of illustration. The exemplary wiring substrate includes at least a conductor layer and a resin insulating layer stacked in one layer respectively, a solder resist layer formed on an outermost surface, portions of an outermost conductor layer exposed from opening portions formed in the solder resist layer, and an Sn-containing underlying layer and solder balls formed on the respective portions of the conductor layer exposed from the opening portions, based on the features of the manufacturing method of the present invention.

Figure 1:
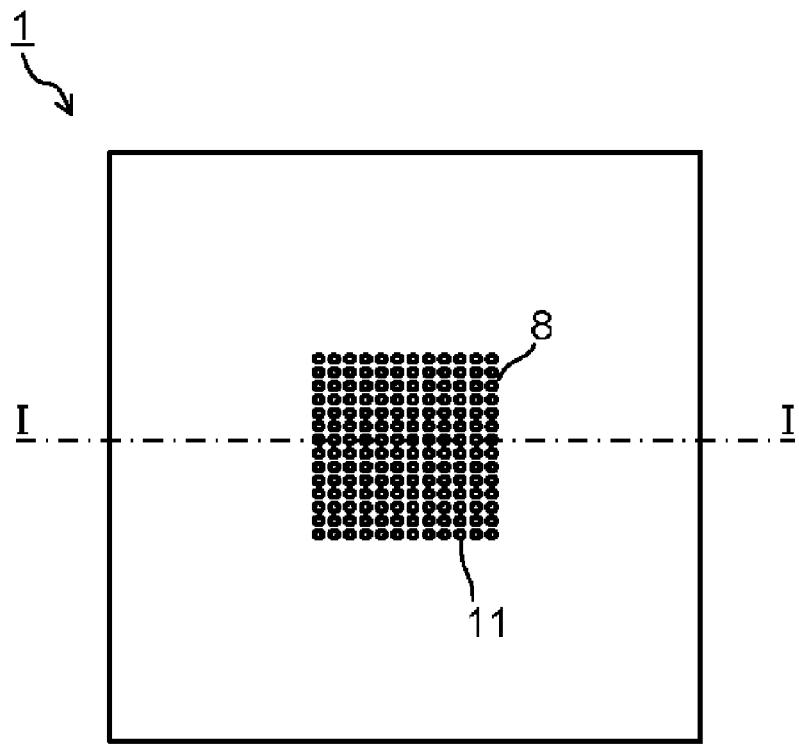
FIG. 1 is a plan view showing a wiring substrate in an embodiment.
Figure 2:
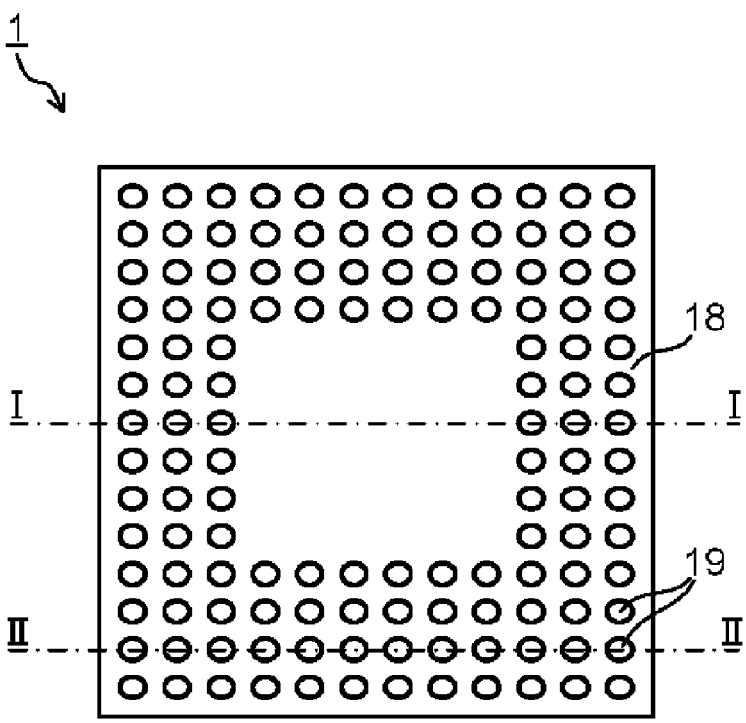
FIG. 2 is a plan view showing the wiring substrate in the embodiment.
Figure 3:
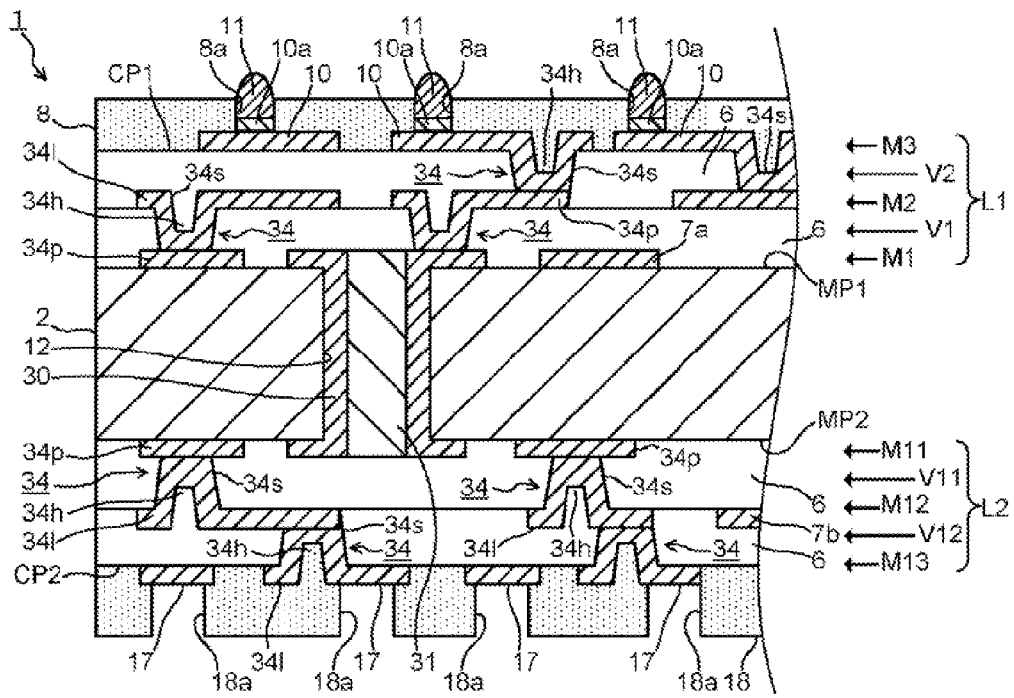
FIG. 3 is a view showing apart of a section in an enlarged fashion when the wiring substrates shown in FIGS. 1 and 2 are cut along line I-I.
Figure 4:
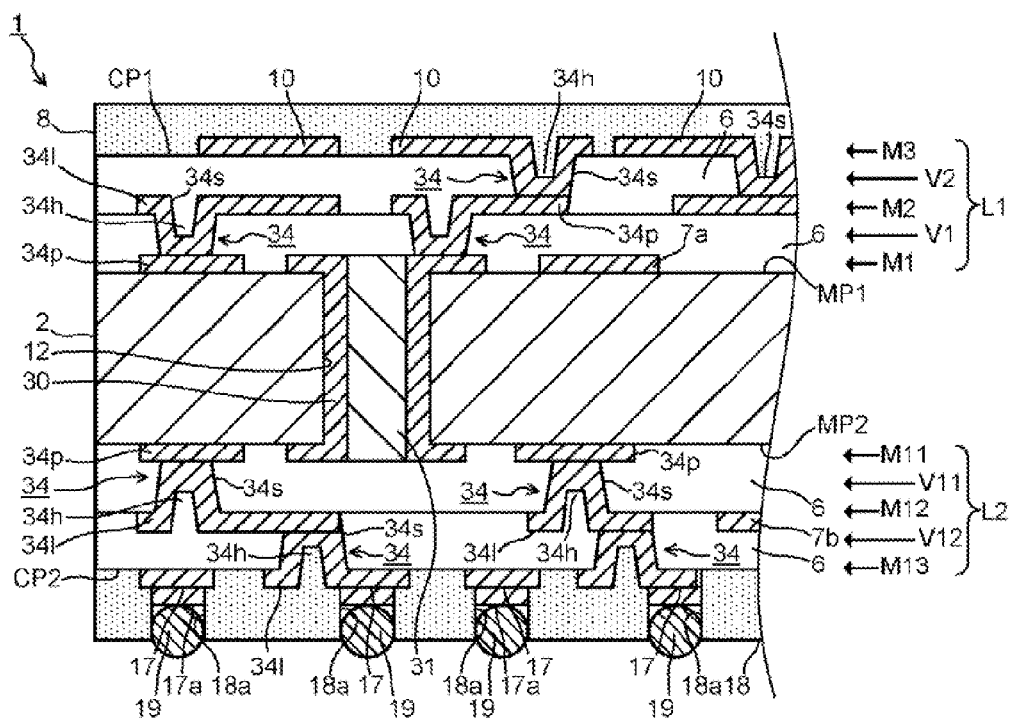
FIG. 4 is a view showing a part of a section in an enlarged fashion when the wiring substrates shown in FIGS. 1 and 2 are cut along line II-II.
Figure 5:
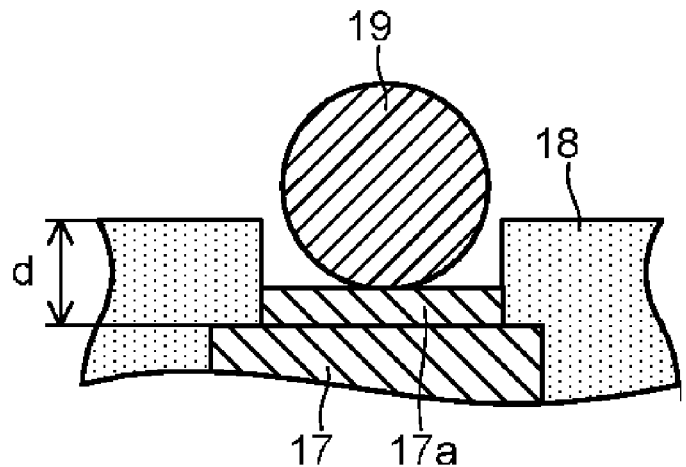
FIG. 5 is a view showing an opening portion 18a, which is formed in a solder resist layer 18 on a lower side, and its neighborhood of the wiring substrates shown in FIG. 3 and FIG. 4 in an enlarged fashion.

FIG. 1 and FIG. 2 are respective plan views of a wiring substrate according to the present embodiment. FIG. 1 shows a state of a wiring substrate when viewed from the upper side, and FIG. 2 shows a state of the wiring substrate shown in FIG. 1 when viewed from the lower side. FIG. 3 is a view showing a part of a section in an enlarged fashion when the wiring substrate shown in FIGS. 1 and 2 is cut along line I-I. FIG. 4 is a view showing a part of a section in an enlarged fashion when the wiring substrate shown in FIGS. 1 and 2 is cut along line II-II. Further, FIG. 5 is a view showing in an enlarged fashion an opening portion 18a, which is formed in a solder resist layer 18 on the lower side, and its neighborhood (vicinity), of the wiring substrate shown in FIG. 3 and FIG. 4. Here, in FIG. 5, this opening portion and its neighborhood (vicinity) are shown upside down to clarify the features of the present invention.

In a wiring substrate 1 shown in FIGS. 1 to 4, core conductor layers M1, M11 (also referred simply to as a "conductor layer" respectively hereinafter) each of which is shaped into a predetermined pattern to constitute a metal wiring 7a are formed on both surfaces of a plate-like core 2 by the Cu plating respectively. This plate-like core 2 is constructed by a heat-resistant resin plate (e.g., a bismuleimide-triazine resin plate), a fiber reinforced resin plate (e.g., a glass-fiber reinforced epoxy resin), or the like. These core conductor layers M1, M11 are formed as a surface conductor pattern that covers most of a surface of the plate-like core 2 respectively, and are used as a power supply layer or a ground layer.

Meanwhile, through holes 12 that are bored with a drill, or the like are formed in the plate-like core 2, and a through hole conductor 30 that causes the core conductor layers M1, M11 to conduct mutually is formed on their inner wall surfaces respectively. The through holes 12 are filled by a resin hole-filling material 31 such as an epoxy resin, or the like.

First via layers (i.e., build-up layers, insulating layers, or resin insulating layers) V1, V11 each formed of a thermosetting resin composite 6 are formed on upper layers of the core conductor layers M1, M11 respectively. First conductor layers M2, M12 each of which is shaped into a predetermined pattern to constitute a metal wiring 7b are formed on their surfaces by the Cu plating respectively. Here, an interlayer connection is provided between the core conductor layers M1, M11 and the first conductor layers M2, M12 by vias 34 respectively. Similarly, second via layers (i.e., build-up layers, insulating layers, or resin insulating layers) V2, V12 each formed of the thermosetting resin composite 6 are formed on upper layers of the first conductors layers M2, M12 respectively.

Second conductor layers M3, M13 having metal terminal pads 10, 17 respectively are formed on the second via layers V2, V12 respectively. An interlayer connection is provided between the first conductor layers M2, M12 and the second conductor layers M3, M13 by the vias 34 respectively. The vias 34 include via holes 34h, via conductors 34s each provided on an inner peripheral surface of the via hole 34h, via pads 34p each provided to be connected to the via conductor 34s at its bottom surface side, and via lands 34l each protruded outward from an opening periphery of the via hole 34h on the opposite side to the via pad 34p.

As described above, the core conductor layer M1, the first via layer V1, the first conductor layer M2, the second via layer V2, and the second conductor layer M3 (i.e., an outermost conductor layer) are stacked sequentially on a first principal surface MP1 of the plate-like core 2 to constitute a first wiring stacking portion L1 (i.e., a laminated layer). The core conductor layer M11, the first via layer V11, the first conductor layer M12, the second via layer V12, and the second conductor layer M13 (i.e., an outermost conductor layer) are stacked sequentially on a second principal surface MP2 of the plate-like core 2 to constitute a second wiring stacking portion L2 (i.e., a laminated layer). Then, a plurality of metal terminal pads 10 are formed on a first main surface CP1, and a plurality of metal terminal pads 17 are formed on a second main surface CP2.

Here, the metal terminal pads 10 are used as the pads (FC pads) to which a semiconductor device (not shown) is flip-chip connected via solder bumps formed later, and constitute a semiconductor device mounting area respectively. As shown in FIG. 1, the metal terminal pads 10 are formed in an almost center portion of the wiring substrate 1, and are aligned like a rectangular shape.

The metal terminal pads 17 are utilized as back surface lands (LGA pads) used to connect the wiring substrate 1 to a mother board. The metal terminal pads 17 are formed in the outer peripheral area of the wiring substrate 1 except the substantially center area, and are aligned like a rectangular shape to surround the substantially center area.

Further, a solder resist layer 8 having opening portions 8a therein is formed on the first principal surface CP1, and then a Sn-containing underlying layer 10a formed by electroless plating is formed on metal terminal pads 10 exposed from the opening portions 8a respectively. Solder bumps 11 that are formed by printing a solder paste and then applying a reflow soldering (i.e., reflow soldering process) to the solder paste are formed on respective portions of the underlying layer 10a.

A solder resist layer 18 having opening portions 18a therein is formed on the second principal surface CP2, then a Sn-containing underlying layer 17a is formed on metal terminal pads 17 exposed from the opening portions 18a respectively, and then solder balls 19 are formed (or mounted) on respective portions of the underlying layer 17a such that these solder balls 19 are connected to the respective portions of the underlying layer 17a (see FIG. 5).

Here, the solder ball 19 can be formed of Sn—Pb, Sn—Ag, Sn—Ag—Cu, or the like, for example. Its size (diameter) can be set within a range of 300 μm to 1300 μm, for example.

In the wiring substrate 1 in the present embodiment, not the conventional solder paste but the Sn-containing underlying layer 17a is formed by the plating on the metal terminal pads 17 exposed from the opening portions 18a respectively. The underlying layer 17a can be formed simply by the plating method such as the electrolytic plating method, the electroless plating method, or the like, for example. Therefore, as shown in FIG. 5, its shape is flat, and it also contains Sn as a main (primary) component. Accordingly, in the wiring substrate 1 in the present embodiment, when the underlying layer 17a is fused by heating and then the solder balls 19 are mounted on the respective portions of the underlying layer 17a, the solder balls 19 are connected firmly to the respective portions of the underlying layer 17a.

Further, a thickness of the underlying layer 17a can be adjusted to a desired level by controlling the forming condition such as a forming time, etc. applied to the underlying layer 17a. Accordingly, even when a depth d of the opening portion 18a (a distance to the metal terminal pad 17 in the opening portion 18a) formed in the solder resist layer 18 is set small in such a situation that a thickness of the underlying layer 17a is maintained to enhance the adhesion to the solder ball, a thickness of the underlying layer 17a can be kept sufficiently small, and thus an extent to which the solder balls 19 are exposed from the opening portion 18a can be made sufficiently small.

Therefore, a shearing force acting to the solder balls 19 in the lateral direction can be decreased. As a result, as shown in FIG. 5 (by example with only a single solder ball), the solder balls 19 never get out of the original mounting positions, and the electrical and mechanical connection between the wiring substrate 1 and the base substrate (not shown) can be held in a good condition.

Figure 6:
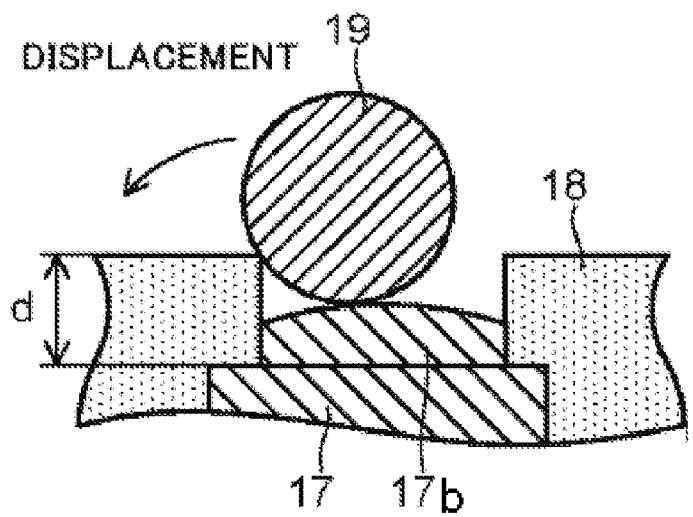
FIG. 6 is a view showing the opening portion 18a, which is formed in the solder resist layer 18 on the lower side, and its neighborhood of the wiring substrates shown in FIG. 3 and FIG. 4 in an enlarged fashion.

Meanwhile, as shown in FIG. 6, when the solder paste 17b is employed like the prior art instead of the Sn-containing underlying layer 17a, this solder paste 17b is formed like a hemispherical shape by the reflow soldering process. Therefore, a contact area between the solder paste 17b and the solder ball 19 mounted thereon is decreased, and thus adhesion between them cannot be improved sufficiently. In particular, as a depth d of the opening portion 18a is set small and/or a thickness of the solder paste 17b, particularly a thickness of the center portion, is increased, a degree at which the solder ball 19 is exposed from the opening portion 18a is increased, and a shearing force acting to the solder ball 19 in the lateral direction is increased.

Therefore, as shown in FIG. 6 (again, by example with only a single solder ball), the solder balls 19 get out of the original mounting positions, and the electrical and mechanical connection between the wiring substrate 1 and the base substrate (not shown) cannot be held sufficiently.

Here, it is preferable that a depth d of the opening portion 18a should be set to 10 μm to 40 μm. In this case, the advantages of the present invention, i.e., the displacement of the solder balls 19 from the original mounting position can be prevented and also the electrical and mechanical connection between the wiring substrate 1 and the base substrate can be held in the good condition, can be achieved more effectively.

It is preferable that a thickness of the underlying layer 17a should be set within a range of 1 μm to 5 μm. In this case, a depth d of the opening portion 18a is set to 10 μm to 40 μm, as described above, in such a situation that adhesion to the solder ball 19 is held sufficiently highly, a degree at which the solder ball 19 is exposed from the opening portion can be decreased, and a shearing force acting to the solder ball 19 in the lateral direction can be reduced. Accordingly, the advantage of the present invention such that the displacement of the solder balls 19 from the original mounting position can be prevented and that the electrical and mechanical connection between the wiring substrate 1 and the base substrate can be held in the good condition can be achieved more effectively.

Further, it is preferable that, when the entire underlying layer is assumed as 100 mass %, the underlying layer 17a should contain Ag by (in an amount of) 0.1 mass % to 1 mass %. For example, when the underlying layer 17a is formed of Sn only, in some cases a whisker occurs from the underlying layer 17a on a time-dependent basis, and this whisker comes into contact with the base substrate, or the like and exerts a bad influence upon the electrical contact with the wiring substrate 1. In this case, when the underlying layer 17a contains a minute amount of Ag as described above, occurrence of the above-mentioned whisker can be suppressed. Accordingly, the above-mentioned bad electrical influence can be suppressed.

In this case, the above disadvantages are caused on a time-dependent basis, and are never caused as a matter of course. Therefore, the process of forming the underlying layer 17a of 100% Sn is not always excluded.

Here, as apparent from FIGS. 1 to 4, the wiring substrate 1 of the present embodiment shows a substantially plate-like rectangular shape, and its size can be set to about 35 mm×about 35 mm×about 1 mm, for example.

Exemplary Wiring Substrate Manufacturing Method

Next, an exemplary wiring substrate manufacturing method of the exemplary wiring substrate shown in FIGS. 1 to 4 will be explained hereunder. FIGS. 7 to 17 are views showing processes in the wiring substrate manufacturing method in the present embodiment. Here, process views shown hereunder illustrate mainly the sequential processes applied to the corresponding sections in FIG. 4 respectively when the wiring substrate is cut along line II-II.

Figure 7:
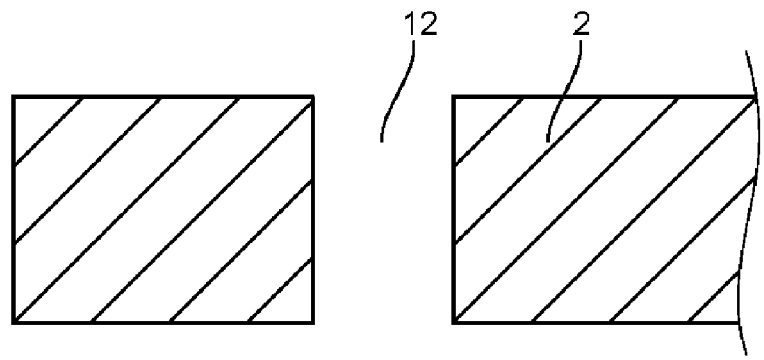
FIG. 7 is a view showing one process in a wiring substrate manufacturing method in the embodiment.
Figure 8:
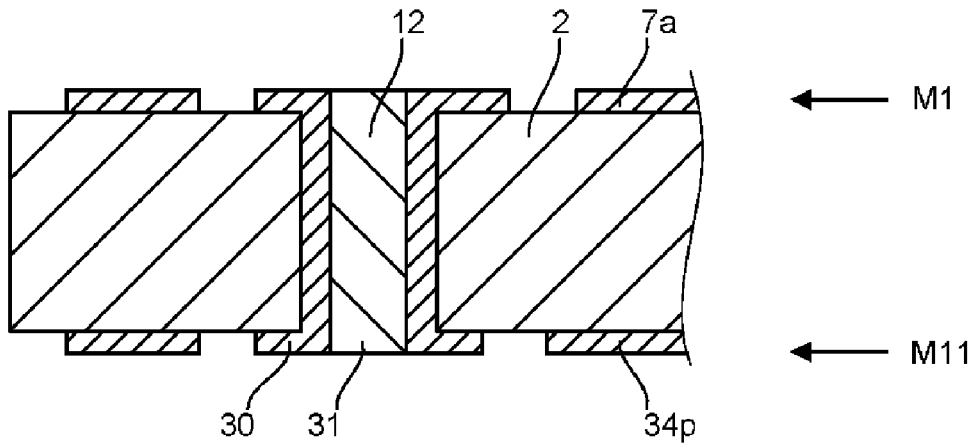
FIG. 8 is a view showing one process in the wiring substrate manufacturing method in the embodiment.

At first, as shown in FIG. 7, a heat-resistant resin plate (e.g., a bismuleimide-triazine resin plate) or a fiber reinforced resin plate (e.g., a glass-fiber reinforced epoxy resin), which is shaped into a plate, is prepared as the core 2, and the through holes 12 are bored by the method such as the drilling, or the like. Then, as shown in FIG. 8, the core conductor layers M1, M11 and the through hole conductors 30 are formed by the pattern plating, and the resin hole-filling material 31 is filled in the through holes 12 respectively.

Figure 9:
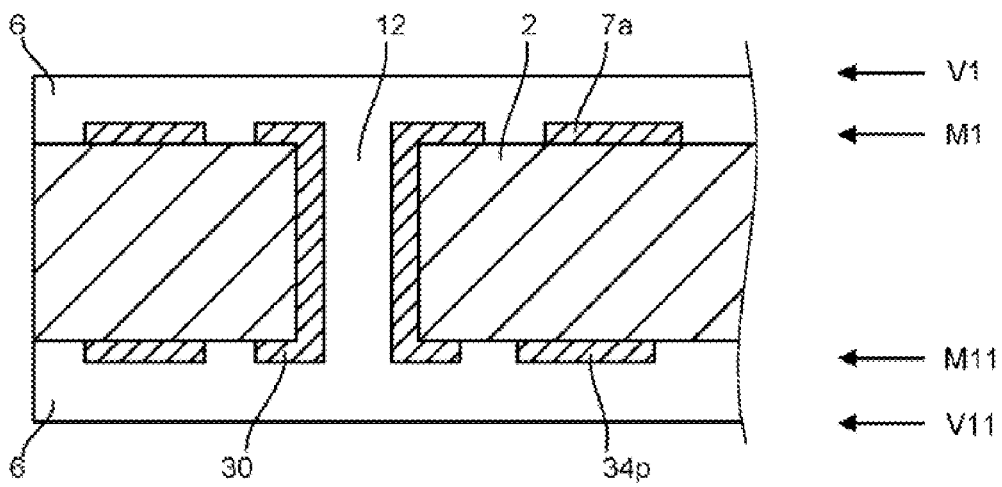
FIG. 9 is a view showing one process in the wiring substrate manufacturing method in the embodiment.

Then, the roughening process is applied to the core conductor layers M1, M11. Then, as shown in FIG. 9, the insulating layers V1, V11 are obtained by laminating the resin film 6 to cover the core conductor layers M1, M11, and then curing the film. As occasion demands, the resin film may contain the fillers.

Figure 10:
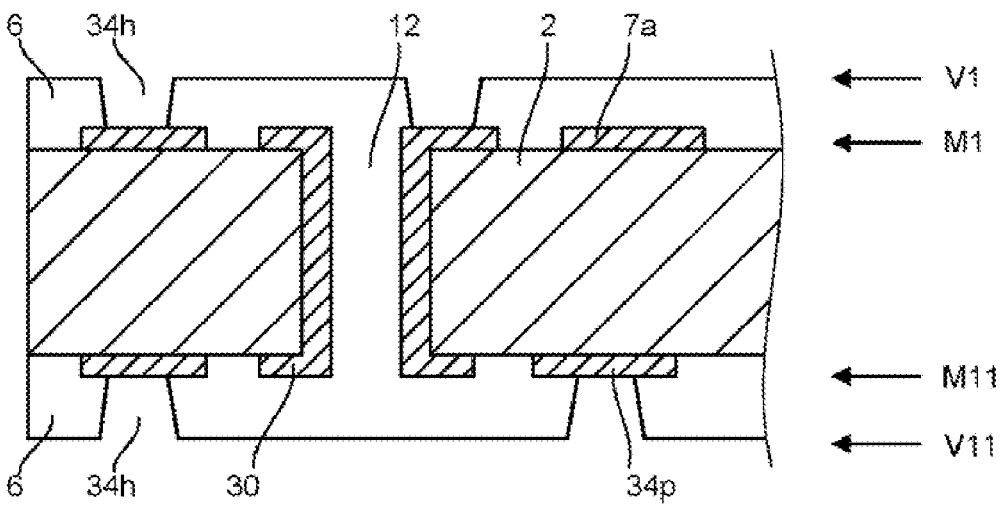
FIG. 10 is a view showing one process in the wiring substrate manufacturing method in the embodiment.

Then, as shown in FIG. 10, the via holes 34h are formed into a predetermined pattern respectively by irradiating the laser beam onto the principal surface of the insulating layers V1, V11 (via layers). Then, the roughening process is applied to the insulating layers V1, V11 containing the via holes 34h. Here, when the roughening process is applied to the insulating layers V1, V11, as described above, in such a situation that the insulating layers V1, V11 contain the fillers, the liberation of the fillers is caused and the fillers still remain on the insulating layers V1, V11. Therefore, the liberated fillers are removed by applying appropriately the water rinsing.

Then, the desmear process and the outline etching are applied to rinse the inside of the via holes 34h. Here, in the present embodiment, flocculation of the fillers caused in the course of the water rinsing in the desmear process can be suppressed since the water rinsing is already applied.

In the present embodiment, the air blowing may be applied between the above water rinsing using a high water pressure and the desmear process. Accordingly, even though the liberated fillers are not completely removed by the above water rinsing, removal of the fillers can be complemented by the air blowing.

Figure 11:
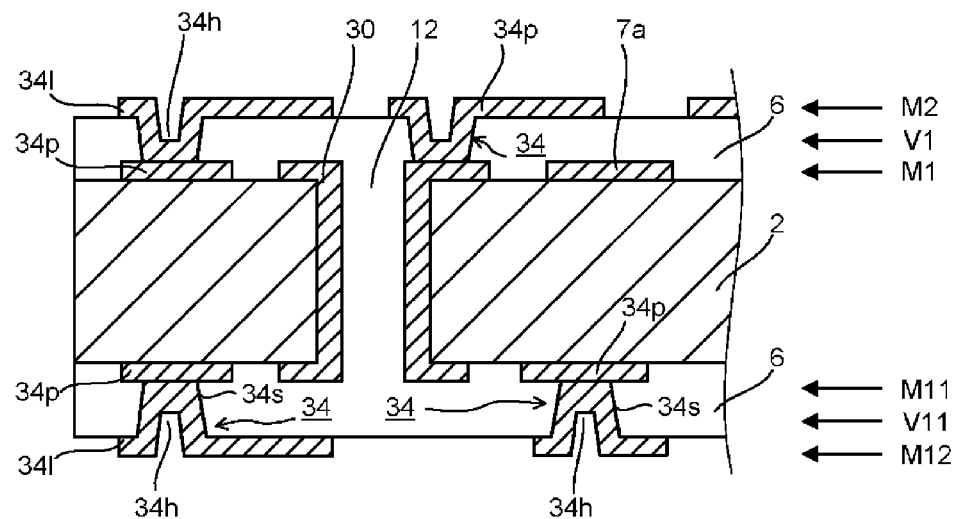
FIG. 11 is a view showing one process in the wiring substrate manufacturing method in the embodiment.

Then, as shown in FIG. 11, the first conductor layers M2, M12 and the via conductors 34s are formed by the pattern plating. The first conductor layer M2, and the like are formed by the semi-additive process, or the like as follows. At first, an electroless copper plating film, for example, is formed on the second via layers V2, V12, then a resist is formed on this electroless copper plating film, and then the first conductor layer M2, and the like are formed by applying the electrolytic copper plating to the resist non-formed areas. In this case, the first conductor layer M2, and the like can be formed as predetermined patterns by peeling/removing the resist using KOH, or the like.

Figure 12:
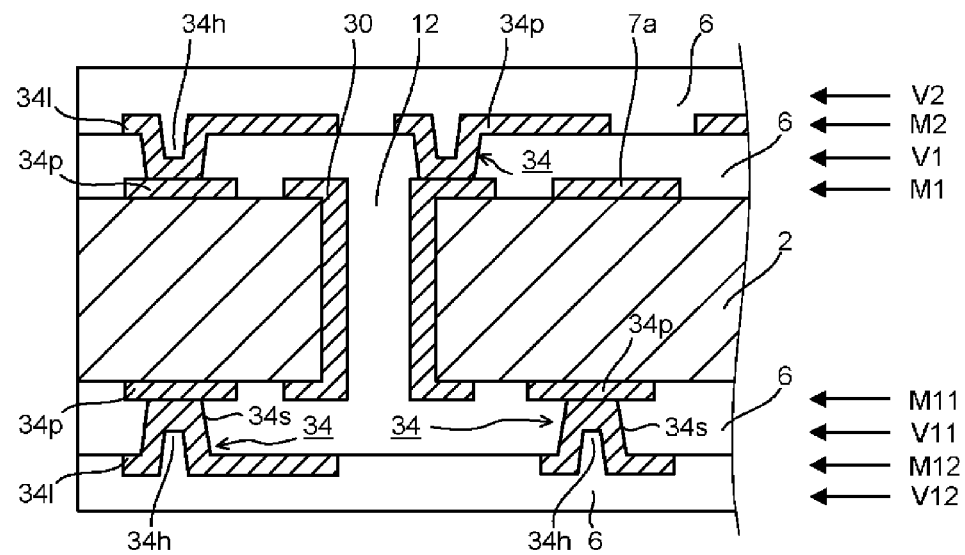
FIG. 12 is a view showing one process in the wiring substrate manufacturing method in the embodiment.

Then, the roughening process is applied to the first conductor layers M2, M12. Then, as shown in FIG. 12, the second via layers V2, V12 are obtained by laminating/curing the resin film 6 to cover the first conductor layers M2, M12. As occasion demands, this resin film may contain the fillers, as described above.

Figure 13:
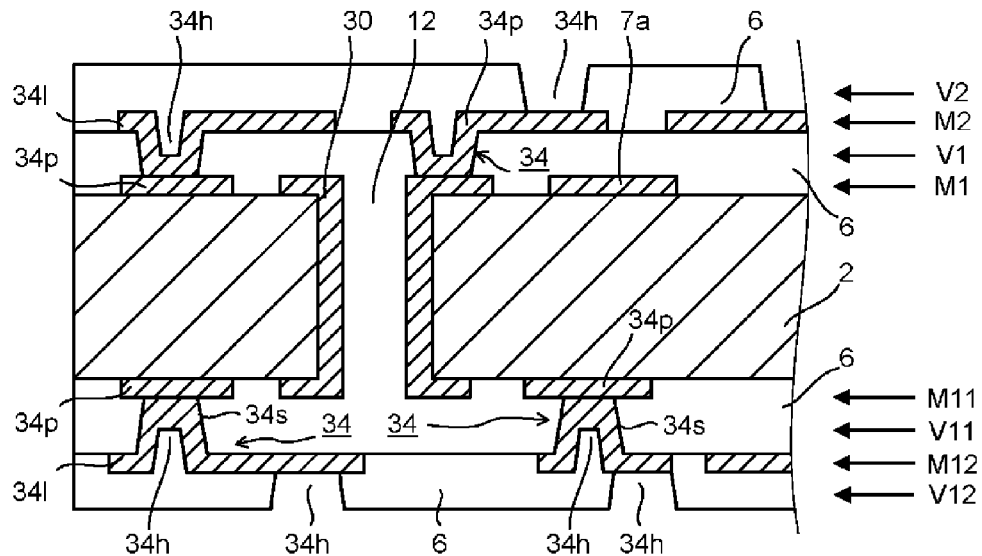
FIG. 13 is a view showing one process in the wiring substrate manufacturing method in the embodiment.

Then, as shown in FIG. 13, the via holes 34h are formed in a predetermined pattern by irradiating the laser beam onto the principal surfaces of the insulating layers V2, V12 (via layers). Then, the roughening process is applied to the insulating layers V2, V12 containing the via holes 34h. When the roughening process is applied to the insulating layers V2, V12, as described above, in such a situation that the insulating layers V2, V12 contain the fillers, the liberation of the fillers is caused and the fillers still remain on the insulating layers V1, V11. Therefore, the water rinsing or the air blowing is applied appropriately like the above. Then, the desmear process and the profile etching (the outline etching) are applied to the via holes 34h to clean the inside of the via holes 34h.

Figure 14:
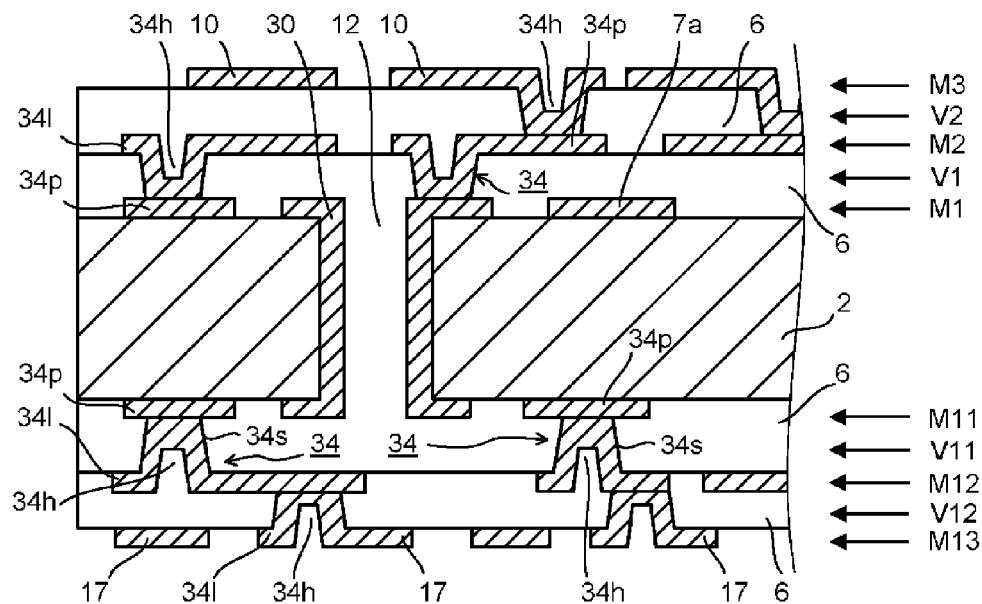
FIG. 14 is a view showing one process in the wiring substrate manufacturing method in the embodiment.

Then, as shown in FIG. 14, the second conductor layers M3, M13 and the via conductors 34s are formed by the pattern plating.

Figure 15:
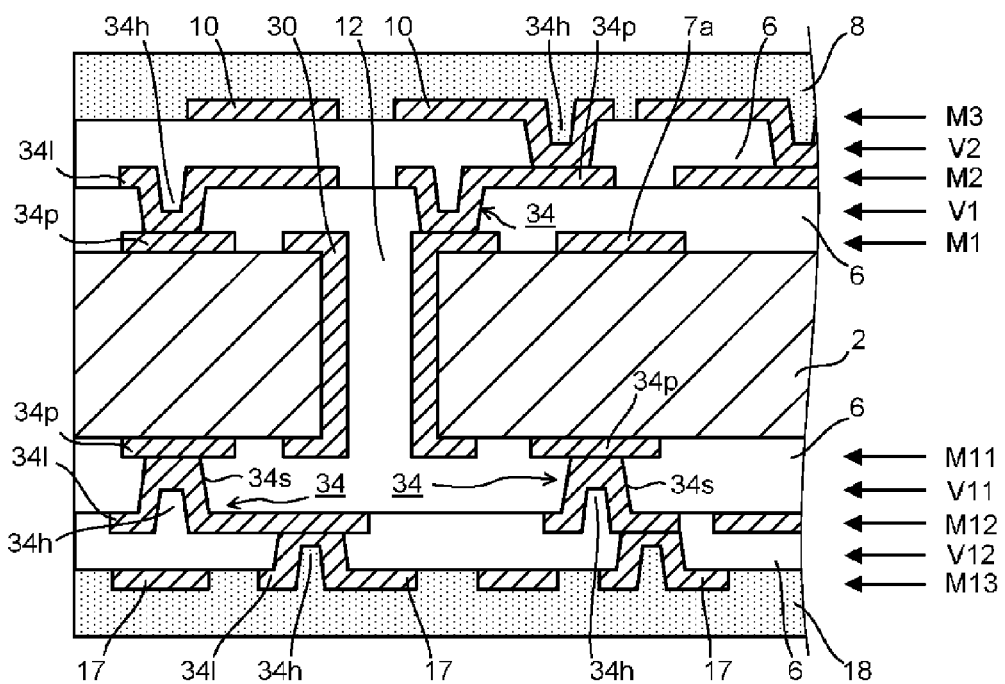
FIG. 15 is a view showing one process in the wiring substrate manufacturing method in the embodiment.
Figure 16:
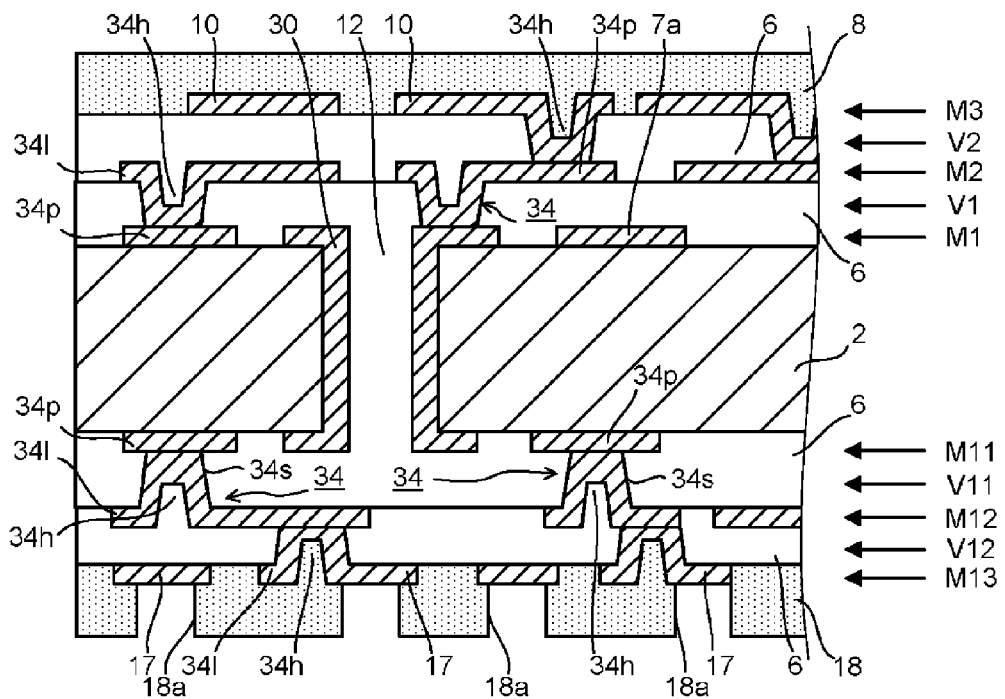
FIG. 16 is a view showing one process in the wiring substrate manufacturing method in the embodiment.
Figure 17:
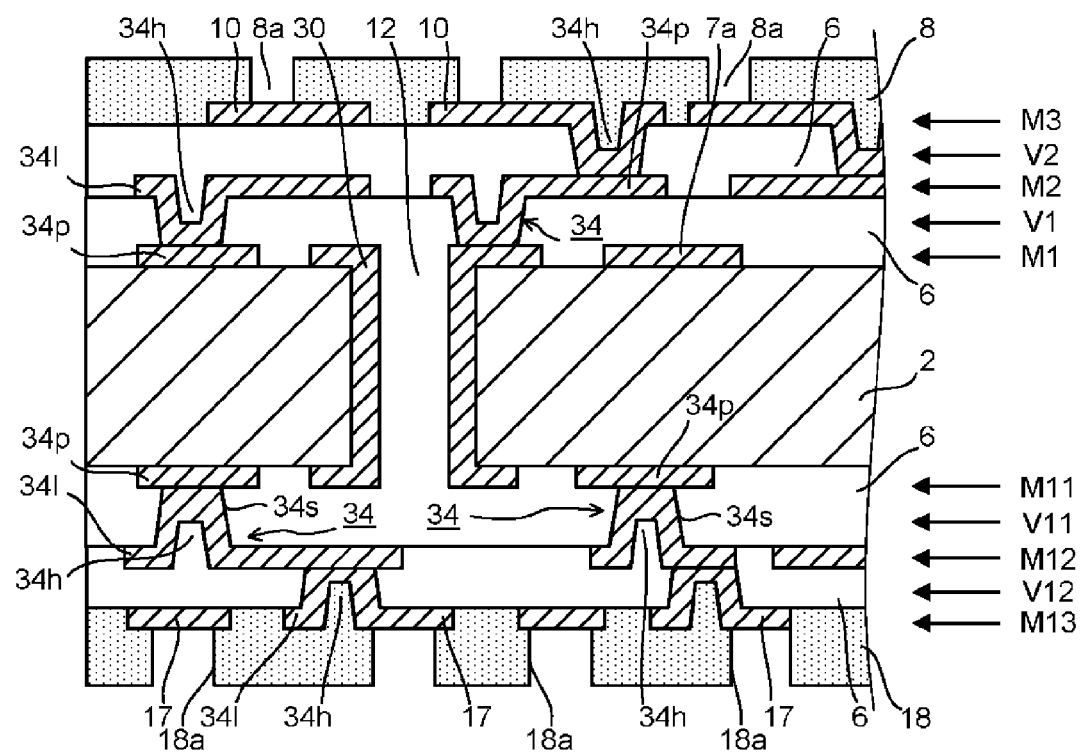
FIG. 17 is a view showing one process in the wiring substrate manufacturing method in the embodiment.

Then, as shown in FIG. 15, the solder resist layers 8 and 18 are formed on the second conductor layers M3, M13 respectively to bury the inside of the via holes 34h. Then, as shown in FIG. 16 and FIG. 17, the opening portions 8a and 18a are formed by applying the resist coating and the exposing/developing processes to the solder resist layers 8 and 18. Here, FIG. 17 is a process view showing the process applied to the corresponding section in FIG. 3 when the wiring substrate is cut along line I-I of the wiring substrate.

Then, in the assembly shown in FIG. 17, as described above, the Sn-containing underlying layer 17a is formed on the metal terminal pads 17 exposed from the opening portions 18a and the metal terminal pads 10 exposed from the opening portions 8a respectively by the plating method such as the electroless plating, the electrolytic plating, or the like, for example, then such underlying layer 17a is fused by applying the reflow soldering process, then the fluxing process of supplying the flux to the surfaces of the Sn-containing underlying layers 17a is applied, as occasion demands, and then the solder balls 19 are mounted directly on the respective portions of the Sn-containing underlying layer 17a being fused on the metal terminal pads 17 and are connected thereto.

The exemplary wiring substrate 1 as shown in FIGS. 1 to 4 is obtained through the above-mentioned steps.

A plasma process can be applied to the solder resist layers 8, 18, if necessary. This plasma process is executed to activate the solder resist layers 8, 18, particularly the surfaces of them, by plasma irradiation. According to this process, for example, the wettability of the solder with respect to the sealing resin layer can be improved in the packaging process, and thus the coating property of the sealing resin layer can be improved. In particular, when an underfill resin should be filled into narrow clearances between the wiring substrate and the semiconductor device, etc., for example, such underfill resin spreads readily over the wiring substrate, i.e., the solder resist layers 8, due to the above improvement of the wettability. As a result, the injection of the underfill resin, which is difficult in the prior art, can be easily executed.

With the above, the present invention is explained in detail while citing the concrete examples. The present invention is not restricted to the above contents, and all variations and modifications can be applied without departing from a scope of the present invention.

For example, in the above concrete examples, the explanation of the wiring substrate 1 having the core substrate 2 is made. But of course the manufacturing method of the present invention can be applied to the wiring substrate 1 that does not have the core substrate 2.

What is claimed is:

1. A wiring substrate manufacturing method, comprising:
preparing a wiring substrate including a core layer having a principal surface, a resin insulating layer and a conductor layer alternately laminated to form at least one laminated layer on the principal surface of the core layer, a solder resist layer including opening portions and formed on an outermost surface of the at least one laminated layer such that respective portions of an outermost conductor layer are exposed from the opening portions;
forming a Sn-containing underlying layer, wherein the step of forming a Sn-containing underlying layer consists of forming the Sn-containing underlying layer on the respective portions of the outermost conductor layer by a plating process; and
fusing the Sn-containing underlying layer by a heating process, then mounting solder balls directly on respective portions of the fused Sn-containing underlying layer, and then connecting the solder balls to the respective portions of the Sn-containing underlying layer.

2. The wiring substrate manufacturing method according to claim 1, wherein a thickness of the solder resist layer corresponding to a depth of the opening portions is 10 μm to 40 μm.

3. The wiring substrate manufacturing method according to claim 1, wherein a thickness of the Sn-containing underlying layer is 1 μm to 5 μm.

4. The wiring substrate manufacturing method according to claim 1, wherein the Sn-containing underlying layer contains Ag in an amount of 0.1 to 1 mass percent.

* * * * *